US012772796B2

(12) United States Patent
Tsutsue

(10) Patent No.: US 12,772,796 B2
(45) Date of Patent: Oct. 20, 2026

(54) SEMICONDUCTOR DEVICE FABRICATION METHOD USING A DEPOSITION APPARATUS WITH A CONTOURED WAFER CARRIER RING

(71) Applicant: WESTERN DIGITAL TECHNOLOGIES, INC., San Jose, CA (US)

(72) Inventor: Makoto Tsutsue, Yokkaichi (JP)

(73) Assignee: Sandisk Technologies, Inc., Milpitas, CA (US)

( * ) Notice: Subject to any disclaimer, the term of this patent is extended or adjusted under 35 U.S.C. 154(b) by 490 days.

(21) Appl. No.: 18/466,108

(22) Filed: Sep. 13, 2023

(65) Prior Publication Data

US 2025/0087525 A1 Mar. 13, 2025

(51) Int. Cl.

| | |
|---|---|
| ***H01L 21/687*** | (2006.01) |
| ***C23C 16/458*** | (2006.01) |
| ***H10P 14/60*** | (2026.01) |
| ***H10P 72/76*** | (2026.01) |
| ***H10P 72/78*** | (2026.01) |

(52) U.S. Cl.
CPC ...... *H10P 72/7611* (2026.01); *C23C 16/4585* (2013.01); *C23C 16/4586* (2013.01); *H10P 14/6336* (2026.01); *H10P 72/78* (2026.01)

(58) Field of Classification Search
CPC .. H10P 72/7611; H10P 72/78; C23C 16/4585; C23C 16/4586
See application file for complete search history.

(56) References Cited

U.S. PATENT DOCUMENTS

| | | | |
|---|---|---|---|
| 6,126,382 | A | 10/2000 | Scales et al. |
| 6,276,998 | B1 | 8/2001 | Sommer et al. |
| 6,390,905 | B1 | 5/2002 | Korovin et al. |
| 6,506,105 | B1 | 1/2003 | Kajiwara et al. |
| 6,558,232 | B1 | 5/2003 | Kajiwara et al. |
| 9,059,140 | B1 | 6/2015 | Margomenos et al. |
| 9,343,358 | B1 | 5/2016 | Xu |
| 9,428,833 | B1 | 8/2016 | Duvall et al. |
| 10,199,326 | B1 | 2/2019 | Ohsaki |
| 10,355,012 | B2 | 7/2019 | Shimabukuro et al. |
| 10,790,296 | B1 | 9/2020 | Yamaha et al. |
| 10,847,408 | B2 | 11/2020 | Makala et al. |
| 10,854,573 | B2 | 12/2020 | Ji et al. |
| 11,094,704 | B2 | 8/2021 | Zhang et al. |
| 11,114,406 | B2 | 9/2021 | Kanakamedala et al. |

(Continued)

*Primary Examiner* — Joseph A Miller, Jr.
(74) *Attorney, Agent, or Firm* — THE MARBURY LAW GROUP PLLC

(57) ABSTRACT

A method includes placing a wafer on a step of a carrier ring in a first vacuum enclosure such that a backside surface of the wafer contacts the step, depositing a film on an exposed portion of the backside surface of the wafer while the backside surface of the wafer is in contact with the step, and depositing a semiconductor device on a front side of the wafer which is opposite to the backside surface of the wafer. The carrier ring includes a bottom surface surrounding an opening in the carrier ring, an upper top surface, a lower top surface of the step, and an inner surface which connects the upper top surface and the lower top surface, and which is inclined outward at a non-zero taper angle relative to the vertical direction which perpendicular to the lower top surface of the step.

5 Claims, 11 Drawing Sheets

(56) References Cited

U.S. PATENT DOCUMENTS

| | | | |
|---|---|---|---|
| 11,473,199 | B2 | 10/2022 | Shimabukuro et al. |
| 11,702,750 | B2 | 7/2023 | Shimabukuro et al. |
| 2005/0104172 | A1 | 5/2005 | Awujoola et al. |
| 2007/0167110 | A1 | 7/2007 | Tseng et al. |
| 2010/0193845 | A1 | 8/2010 | Roy et al. |
| 2012/0021673 | A1 | 1/2012 | Chen et al. |
| 2017/0178898 | A1 | 6/2017 | Kang et al. |
| 2018/0023404 | A1 | 1/2018 | Brunelli et al. |
| 2020/0312633 | A1 * | 10/2020 | Rathnasinghe ... H01J 37/32642 |
| 2021/0134819 | A1 | 5/2021 | Zhang et al. |
| 2021/0388500 | A1 | 12/2021 | Shimabukuro et al. |
| 2021/0388502 | A1 | 12/2021 | Shimabukuro et al. |

* cited by examiner

SEMICONDUCTOR DEVICE FABRICATION METHOD USING A DEPOSITION APPARATUS WITH A CONTOURED WAFER CARRIER RING

FIELD

The present disclosure relates generally to the field of semiconductor manufacturing, and specifically to a semiconductor device fabrication method using a deposition apparatus with a contoured wafer carrier ring.

BACKGROUND

A wafer carrier ring can be employed in a semiconductor manufacturing equipment to support a wafer at a peripheral portion while exposing a backside surface of the wafer to a deposition ambient. A backside film can be deposited on the backside surface of the wafer. Reliable placement of the wafer on the wafer carrier ring requires an increase in the contact area between the wafer and the wafer carrier ring, which decreases an effective area for deposition of the backside film. Reduction of the contact area between the wafer and the carrier ring can result in misplacement or tilting of the wafer, which results in misprocessing of the wafer.

SUMMARY

According to an aspect of the present disclosure, a method includes placing a wafer on a step of a carrier ring in a first vacuum enclosure such that a backside surface of the wafer contacts the step; depositing a film on an exposed portion of the backside surface of the wafer while the backside surface of the wafer is in contact with the step; and depositing a semiconductor device on a front side of the wafer which is opposite to the backside surface of the wafer. The carrier ring includes a bottom surface surrounding an opening in the carrier ring, an upper top surface, a lower top surface of the step, and an inner surface which connects the upper top surface and the lower top surface, and which is inclined outward at a non-zero taper angle relative to the vertical direction which perpendicular to the lower top surface of the step.

According to another aspect of the present disclosure, a carrier ring for a deposition apparatus, comprises an annular bottom surface having a circular bottom inner periphery; an upper top surface having a circular upper outer periphery and having a closed upper inner periphery; a lower top surface vertically offset downward relative to the upper top surface and comprising a circular lower inner periphery that defines an opening in the carrier ring and comprising a closed lower outer periphery; and a contoured inner sidewall that connects the closed upper inner periphery and the closed lower outer periphery and comprising at least one edge at which a respective pair of inner sidewall segments are adjoined to each other at a respective angle that is greater than or less than 180 degrees.

DETAILED DESCRIPTION

As discussed above, the embodiments of the present disclosure are directed to a semiconductor device fabrication method and to a deposition apparatus with a contoured wafer carrier ring and methods for operating the same, the various aspects of which are described below.

Conventional carrier rings in a backside deposition chamber include tabs for supporting peripheral portions of the backside surface of the wafer. While increasing the size of the tabs prevents accidental dropping of the wafer into an opening in a carrier ring, the large tabs increase the peripheral area on the backside surface of the wafer on which a backside film is not deposited. Conversely, decreasing the size of the tabs decreases the peripheral area without the deposited backside film but increases the probability of misplacement of the wafer on the carrier ring and/or "fall-through" of the wafer through an opening in the carrier ring. The embodiments of the present disclosure provide a contoured carrier ring that improvise the reliability of the placement of a wafer on the carrier while minimizing the area of a peripheral portion of the bottom surface on which the backside film is not deposited.

Figure 1A:
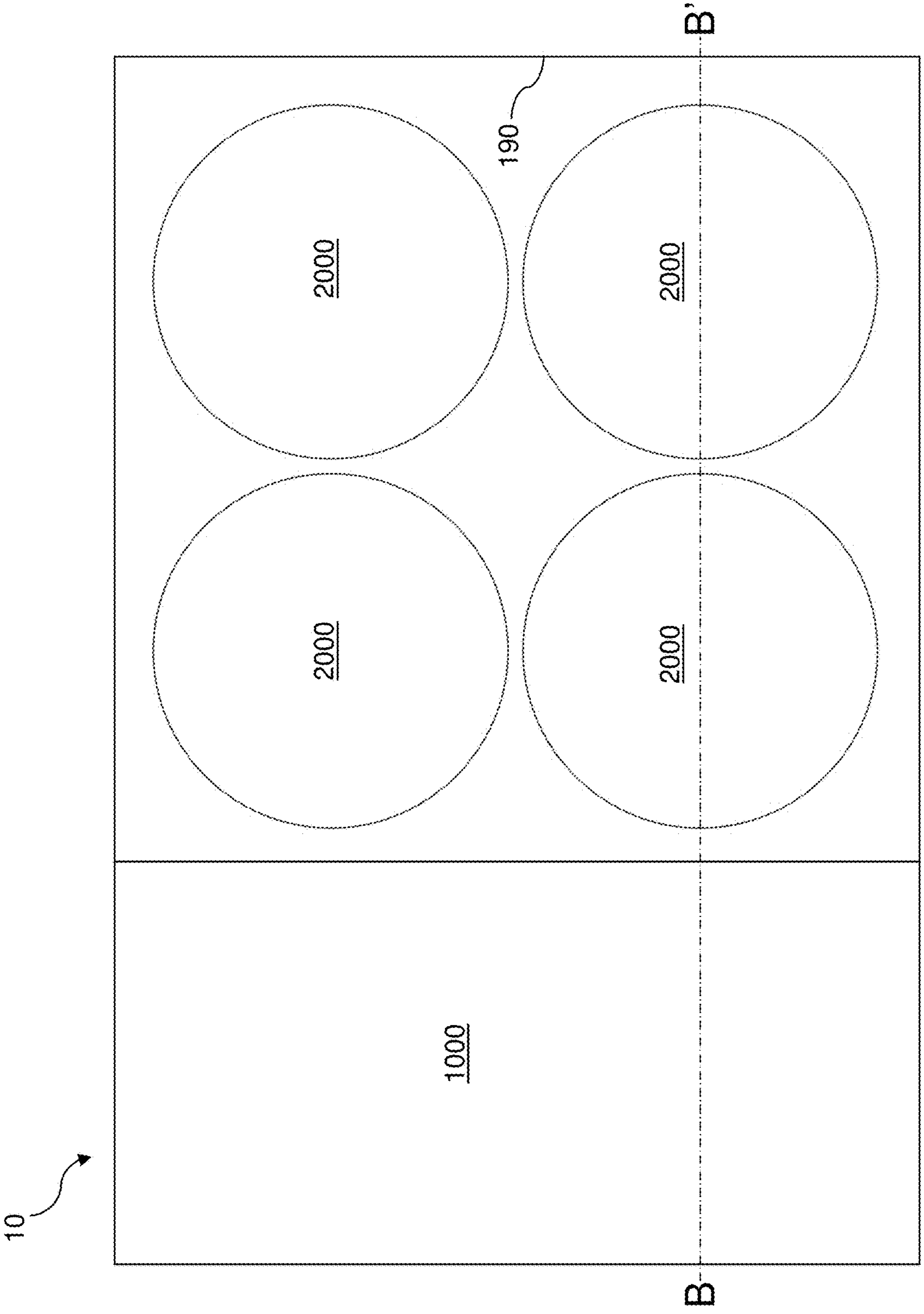
FIG. 1A is a schematic see-through top-down view of an exemplary deposition apparatus according to an embodiment of the present disclosure.
Figure 1B:
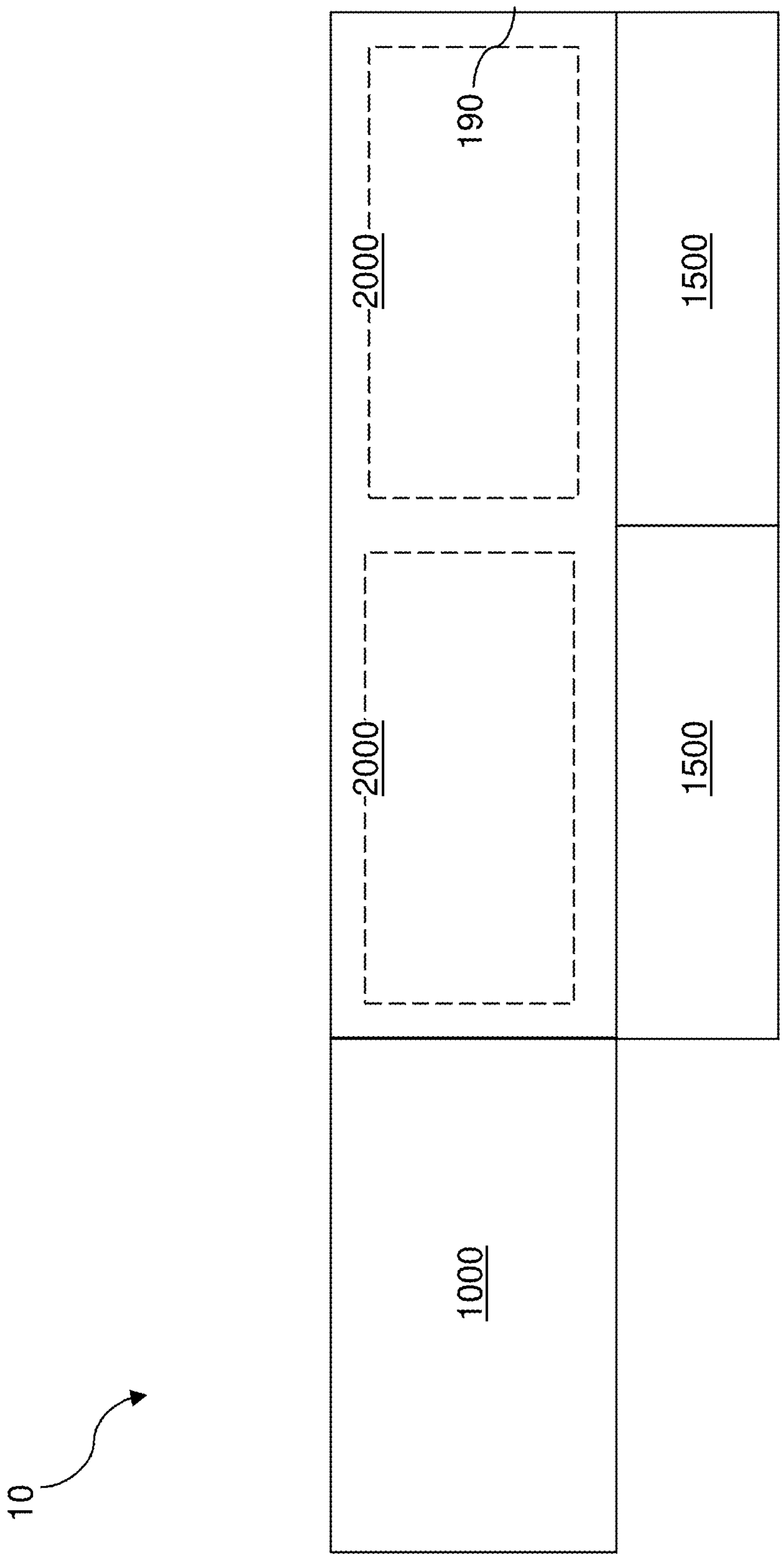
FIG. 1B is a schematic vertical cross-sectional view along the vertical plane B-B' of FIG. 1A.

Referring to FIGS. 1A and 1B, an exemplary deposition apparatus 10 according to an embodiment of the present disclosure is illustrated in a plan view. The exemplary deposition apparatus 10 may comprise a cluster tool which comprises a loading/unloading unit 1000 and at least one deposition unit 2000 that is enclosed within a vacuum enclosure 190. Suitable load locks (not shown) may be provided between the loading/unloading unit 1000 and the at least one deposition unit 2000, and between the loading/unloading unit 1000 and the ambient. In one embodiment, the at least one deposition unit 2000 may comprise a plurality of deposition units 2000. If the deposition unit 2000 comprises a plasma-type unit, such as a plasma enhanced chemical vapor deposition (PECVD) chamber, then a radio-frequency (RF) generator 1500 may be provided for each deposition unit 2000, and may be electrically coupled to the bottom electrode and the top electrode of each deposition unit 2000. Alternatively, RF generator 1500 may be omitted if the deposition unit comprises a non-plasma type deposition unit, such as a low pressure chemical vapor deposition chamber or an atomic layer deposition chamber.

The loading/unloading unit 1000 is configured to mount at least one open cassette, at least one SMIF (Standard Manufacturing Interface) pod, and/or at least one FOUP (Front Opening Unified Pod). Each cassette, each SMIF pod, and/or each FOUP are configured to hold a plurality of wafers (e.g., silicon wafers), such as 25-30 wafers. The SMIF and the FOUP are an airtight container that can house a wafer cassette, and can be sealed to provide an airtight environment to wafers located within the wafer cassette. At least one transfer robot (not shown) can be provided within the loading/unloading unit 1000 and/or within the at least one deposition unit 2000 to transport wafers between the loading/unloading unit 1000 and the at least one deposition unit 2000.

Figure 2A:
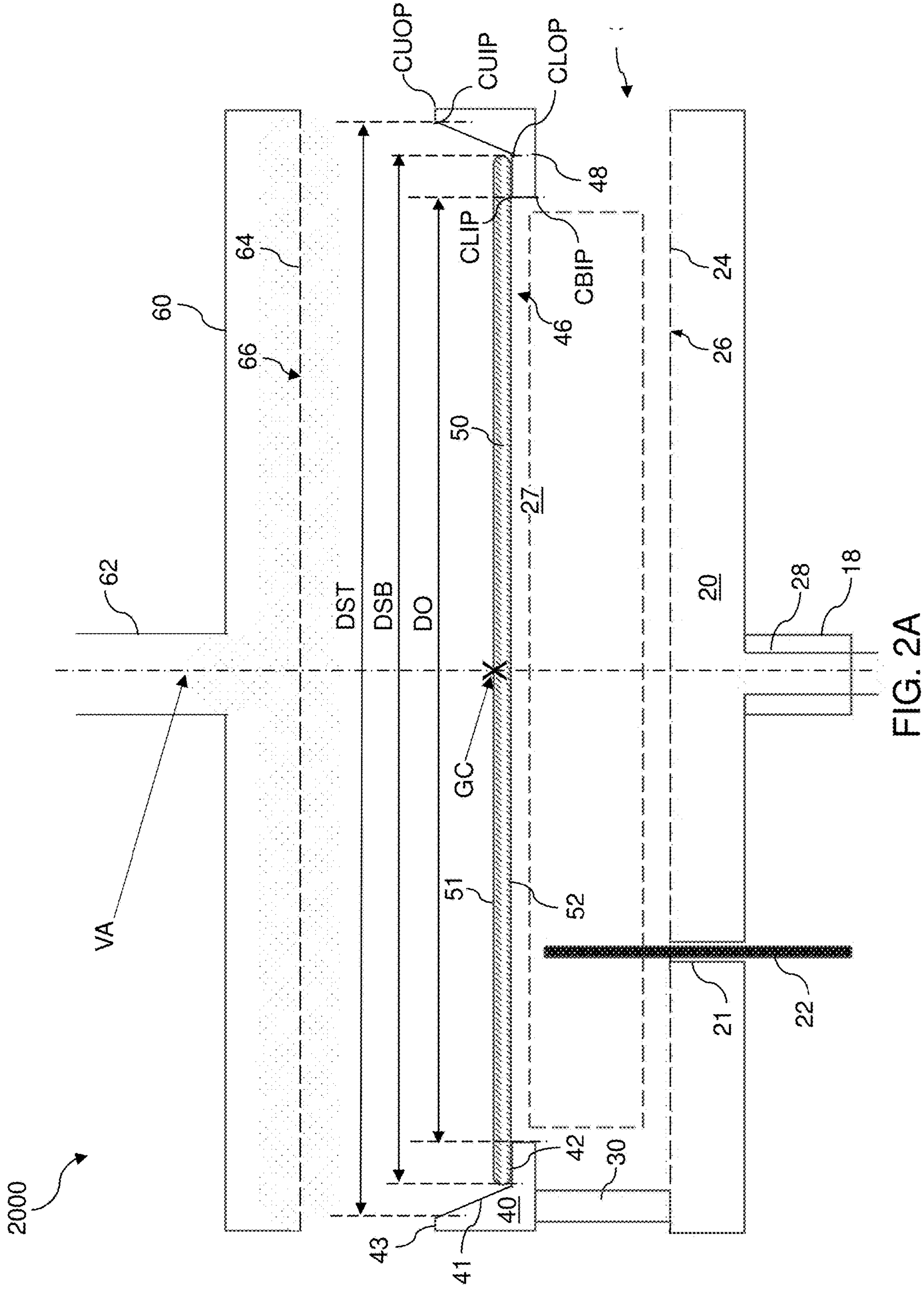
FIG. 2A is a schematic vertical cross-sectional view of a deposition unit of the deposition apparatus of FIGS. 1A and 1B.
Figure 2B:
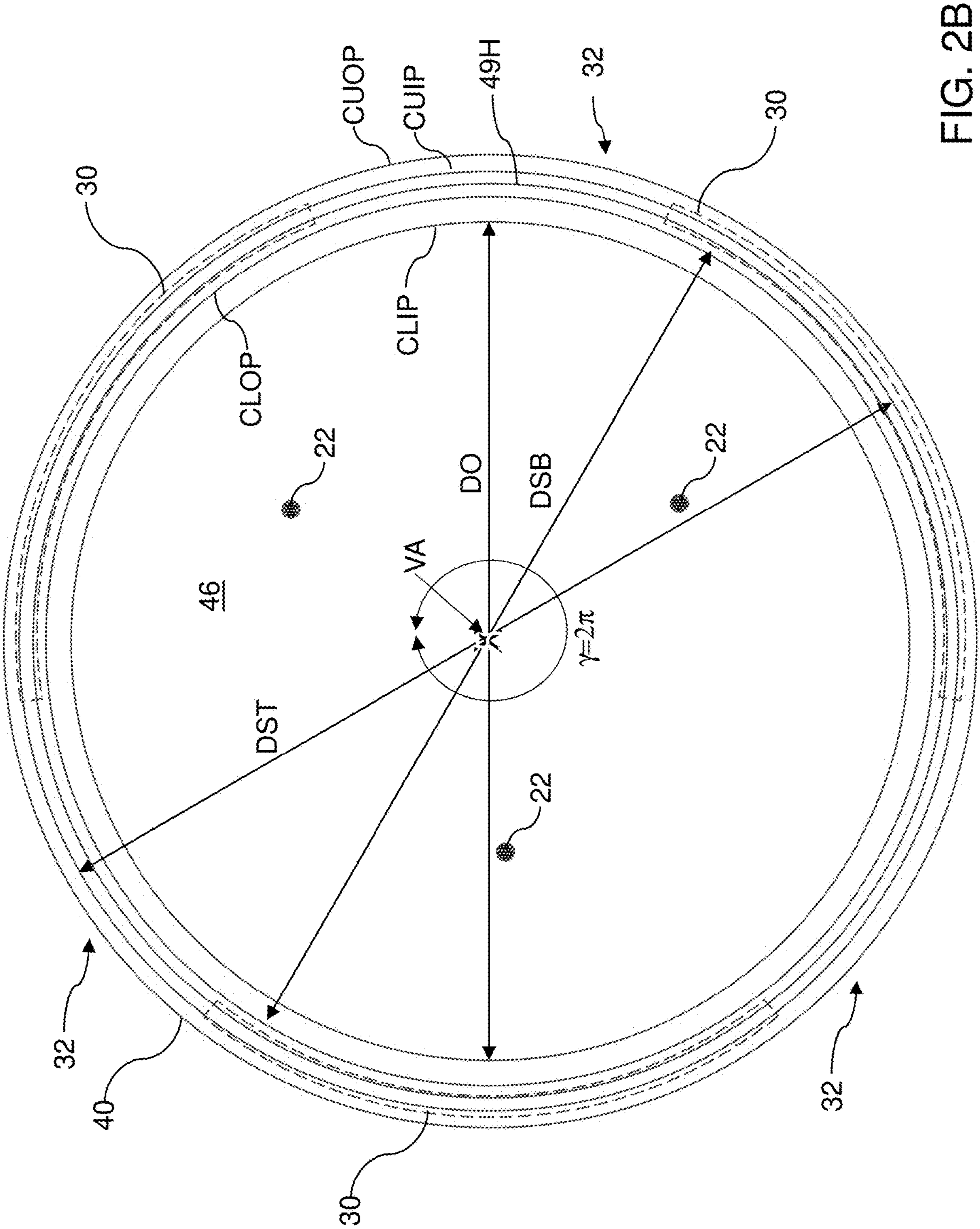
FIG. 2B is a top-down view of a first configuration of the deposition unit of FIG. 2A.

Referring to FIGS. 2A and 2B, a deposition unit 2000 of the deposition apparatus 10 of FIGS. 1A and 1B is illustrated. The deposition unit 2000 is a deposition apparatus that includes a support 20, a carrier ring 40 having an opening therethrough and overlying the support 20, and at least one dielectric spacer 30 interposed between the support 20 and the carrier ring 40 and providing mechanical support to the carrier ring 40. In one embodiment, if the deposition unit 2000 comprises a plasma-type deposition unit, such as a PECVD chamber, then the support 20 may comprise a bottom electrode, and the deposition unit 2000 additionally includes a top electrode 60 overlying the carrier ring 40.

A vacuum enclosure 190 (shown in FIGS. 1A and 1B) encloses the bottom electrode 20, the carrier ring 40, the at least one dielectric spacer 30, and the top electrode 60. The bottom electrode 20 can be vertically spaced from a bottom wall of the vacuum enclosure 190 by an insulating support structure 18, which may comprise an electrical feedthrough that electrically connects the bottom electrode 20 to a driver output node of the RF generator 1500. Another driver output node (such as a ground node) of the RF generator 1500 can be electrically connected to the top electrode 60.

The deposition unit 2000 comprises a processing gas distribution manifold 24 that is configured to supply at least one processing gas into the vacuum enclosure 190. In one embodiment, the processing gas distribution manifold 24 may comprise a showerhead including an array of holes 26 therethrough and functioning as a top plate of the bottom electrode 20. In this case, a processing gas feedthrough pipe 28 may extend through the vacuum enclosure 190 and the insulating support structure 18 and may be connected to an opening in the bottom electrode 20 so that the at least one processing gas can be supplied into and can be distributed out of the bottom electrode 60 toward the backside surface 52 of the wafer 50. In one embodiment, the processing gas may comprise a mixture of silane and at least one of ammonia, nitrous oxide and/or nitrogen to deposit a silicon nitride stress compensation film 94 on the backside surface 52 of the wafer 50, as described below with respect to FIG. 8. Other suitable processing gases used to deposit a film by CVD or ALD may also be used.

The deposition unit 2000 also optionally comprises a purge gas distribution manifold 64 that is configured to supply at least one purge and/or cleaning gas into the vacuum enclosure 190. In one embodiment, the purge gas distribution manifold 64 may comprise a showerhead including an array of holes 66 therethrough and functioning as a bottom plate of the top electrode 60. In this case, a purge gas feedthrough pipe 62 may extend through the vacuum enclosure 190 and may be connected to an opening in the top electrode 60 so that the at least one purge and/or cleaning gas can be supplied into and can be distributed out of the top electrode 60. In one embodiment, the purge gas may comprise nitrogen gas and the cleaning gas may comprise a mixture of $NF_3$ and argon.

The bottom electrode 20, the top electrode 60, and the carrier ring 40 may have a continuous rotational symmetry (i.e., a symmetry that provides invariance upon rotation at any angle) around a vertical axis VA passing through a geometrical center GC of the carrier ring 40 except for patterns of discrete openings in the bottom electrode 20 and optionally except for the pattern of the holes (26, 66) in the respective gas distribution manifolds (24, 64). As used herein, a geometrical center of an element refers to the center of gravity of a hypothetical element occupying the same volume as the element.

A set of K discrete holes 21 that are azimuthally spaced apart around the vertical axis VA by an angle 2p/K can be provided within the bottom electrode 20, where K is an integer greater than one. For example, 2≤K≤8. In the embodiment shown in FIG. 2B, K=3. A set of K lift pins 22 can vertically extend through the set of K discrete holes 21. The set of K lift pins 22 can be configured to move vertically during placement and lifting of a wafer 50 on the carrier ring 40. The wafer 50 that is placed on the carrier ring 40 comprises a front surface 51 that faces the top electrode 60 and a backside surface 52 that faces the bottom electrode 20. A plasma zone 27 is provided between the backside surface 52 of the wafer 50 and the top surface of the bottom electrode 20. During generation of plasma in the plasma zone 27, i.e., during a deposition process, the set of K lift pins 22 can be retracted into or below the bottom electrode 20 to prevent damages to the lift pins 22 and to prevent arcing.

The at least one dielectric spacer 30 may comprise a plurality of discrete dielectric spacers 30 that are laterally spaced apart from each other. Lateral openings 32 are present between the discrete dielectric spacers 30 so that the at least one purge and/or cleaning gas that flows out of the gas distribution manifold 64 can diffuse into the volume of the plasma zone 27 during a deposition step. A vacuum port (not illustrated) can be provided in a wall of the vacuum enclosure 190.

If present, the radio-frequency signal generator 1500 (illustrated in FIG. 1B) can be configured to apply a radio-frequency electrical bias voltage across the bottom electrode 20 and the top electrode 60 and to generate a plasma of the at least one processing gas in the plasma zone 27 between the bottom electrode 20 and a horizontal plane including the annular bottom surface 48 of the carrier ring 40.

Figure 3A:
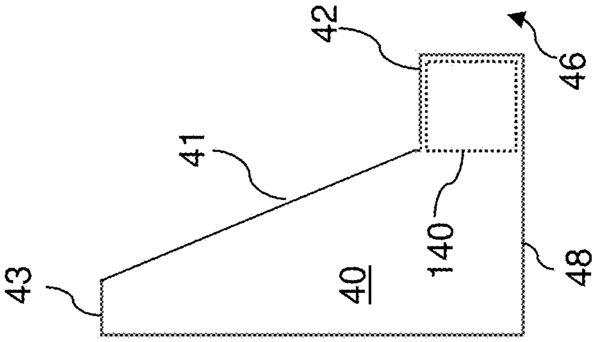
FIGS. 3A-3C are various vertical cross-sectional profiles of a carrier ring within the first configuration of the deposition unit illustrated in FIGS. 2A and 2B.
Figure 3B:
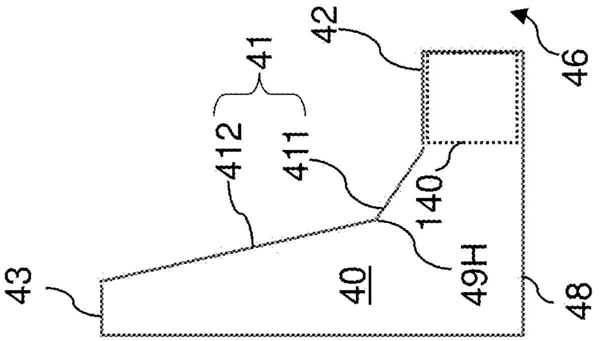
Figure 3C:
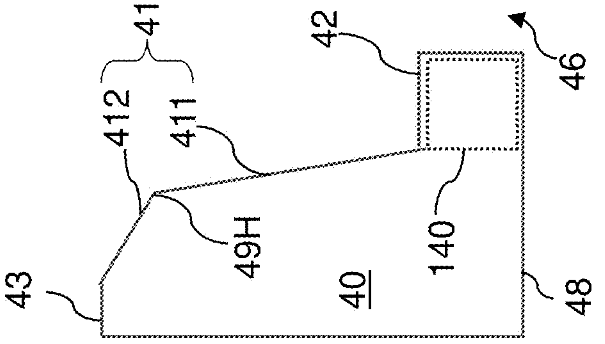

The carrier ring 40 includes geometrical features that facilitate self-aligned placement of the wafer 50 over an opening 46 in the carrier ring 40 and minimizes the area of a peripheral portion of the backside surface 52 of the wafer 50 that contacts the carrier ring 40. FIGS. 3A-3C are various vertical cross-sectional profiles of a carrier ring 40 within the first configuration of the deposition unit illustrated in FIGS. 2A and 2B.

Referring collectively to FIGS. 2A, 2B, and 3A-3C, the carrier ring 40 comprises an annular bottom surface 48 having a circular bottom inner periphery CBIP and facing the top surface of the bottom electrode 20. The circular bottom inner periphery CBIP defines a lateral extent of the opening 46 through the carrier ring 40, and has a shape of a circle having a center at the vertical axis VA that passes through the geometrical center GC of the carrier ring 40. The diameter of the circular bottom inner periphery CBIP is herein referred to as an opening diameter DO.

The carrier ring 40 further comprises an upper top surface 43 facing a bottom surface of the top electrode 60, having a circular upper outer periphery CUOP, and having a closed upper inner periphery CUIP. The circular upper outer periphery CUOP has a shape of a circle having a center at the vertical axis VA. The circular upper outer periphery CUOP has a shape of a circle in the first configuration illustrated in FIGS. 2B and 3A-3C, but generally may have a non-circular shape in other configurations. The closed upper inner periphery CUIP is connected to a top periphery of a contoured inner sidewall 41. The diameter of the closed upper inner periphery CUIP is herein referred to as a sidewall top diameter DST.

In addition, the carrier ring 40 comprises a step 140 which protrudes outward from the bottom end of the contoured inner sidewall 41. The step 140 includes a lower top surface 42 configured to support the wafer 50 during deposition of a film on the bottom surface 52 of the wafer 50. The lower top surface 42 vertically offset downward relative to the upper top surface 43 and comprising a circular lower inner periphery CLIP that defines the opening 46 of the carrier ring 40 and comprising a closed lower outer periphery CLOP. The circular lower inner periphery CLIP may be congruent with the circular bottom inner periphery CBIP. The closed lower outer periphery CLOP is connected to a bottom periphery of the contoured inner sidewall 41. The diameter of the closed lower outer periphery CLOP is herein referred to as a sidewall bottom diameter DSB. Generally, the sidewall bottom diameter DSB is greater than the opening diameter DO, and is less than the sidewall top diameter DST. An outer periphery of the backside surface 52 of the wafer 50 contacts the lower top surface 42 of the step 140 upon placement of the wafer 50 on the carrier ring 40.

The contoured inner sidewall 41 connects the closed upper inner periphery CUIP and the closed lower outer periphery CLOP. The contoured inner surface 41 may be inclined outward at a non-zero taper angle relative to the vertical direction, as shown in FIG. 3A. For example, the contoured inner surface 41 may be a flat surface that is inclined outward away from the opening 46 at the taper angle of 10 to 60 degrees, such as 30 to 45 degrees, relative to the vertical direction which is perpendicular to the lower top surface 42 of the step 140. As used herein, inclined outward away from the opening 46 means that the closed upper inner periphery CUIP at the top of the sidewall 41 is located farther in the radial outward direction from the circular lower inner periphery CLIP than the closed lower outer periphery CLOP at the bottom of the sidewall 41 is located from the circular lower inner periphery CLIP.

In another embodiment, the contoured inner sidewall 41 may be inclined outward and comprise and/or consist of a laterally-concave surface, as shown in FIG. 3B. As used herein, a laterally-concave surface refers to a surface having a concave vertical cross-sectional profile, as shown in FIG. 3B. In the embodiment shown in FIG. 3B, the contoured inner sidewall 41 may comprise a plurality of inner sidewall segments (411, 412) and at least one edge, such as an arc-shaped horizontally-extending edge 49H, at which a respective pair of inner sidewall segments (411, 412) are adjoined to each other at an angle less than 180 degrees. In other words, the outward taper angles (as measured relative the vertical direction in a vertical cross-sectional view) of the inner sidewall segments (411, 412) may be different from each other, such that the bottom surface segment 411 has a greater outward taper angle than the top surface segment 412. As used herein, an arc refers to a segment of a circle having any angle not greater than 2p.

In another embodiment, the contoured inner sidewall 41 may be inclined outward and comprise and/or consist of a laterally-convex surface, as shown in FIG. 3C. As used herein, a laterally-convex surface refers to a surface having a convex vertical cross-sectional profile, as shown in FIG. 3C. In the embodiment shown in FIG. 3C, the contoured inner sidewall 41 may comprise a plurality of inner sidewall segments (411, 412) and at least one edge, such as an arc-shaped horizontally-extending edge 49H, at which a respective pair of inner sidewall segments (411, 412) are adjoined to each other at an angle greater than 180 degrees. In other words, the outward taper angles (as measured relative the vertical direction in a vertical cross-sectional view) of the inner sidewall segments (411, 412) may be different from each other, such that the top surface segment 412 has a greater outward taper angle than the bottom surface segment 411.

In general, a contoured inner sidewall 41 may comprise at least one an arc-shaped horizontally-extending edge 49H having an azimuthal angle of at least p/24 around a vertical axis VA passing through a geometrical center GC of the carrier ring 40. In the illustrated example of FIGS. 2B and 3B-3C, the azimuthal angle g can be 2p. In one embodiment, the contoured inner sidewall 41 comprises a first surface segment 411 having a first outward taper angle relative to a vertical direction, and a second surface segment 412 having a second outward taper angle relative to the vertical direction that is different from the first outward taper angle. In one embodiment, the first horizontally-concave surface segment 411 may have a bottom edge that coincides with the closed lower outer periphery CLOP, and the second horizontally-concave surface segment 412 may have a top edge that coincides with the closed upper inner periphery CUIP.

FIGS. 4A-4D are sequential schematic vertical cross-sectional views of a deposition unit 2000 during a wafer 50 transfer and placement according to an embodiment of the present disclosure.

Figure 4A:
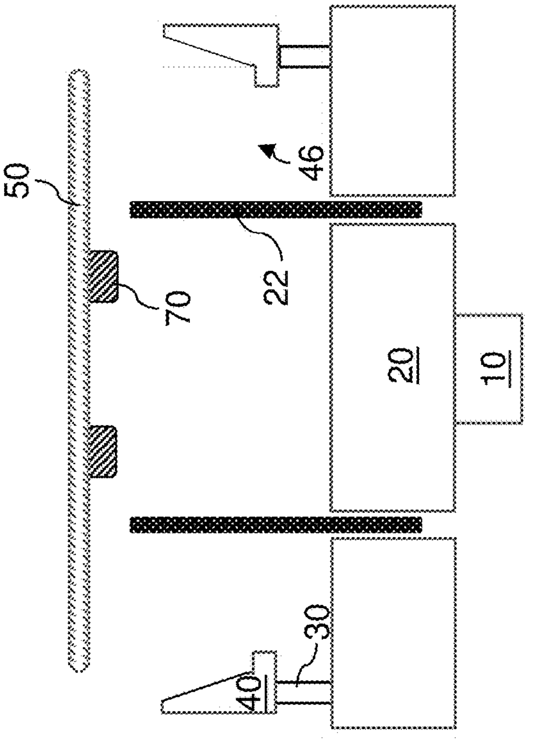
FIGS. 4A-4D are sequential schematic vertical cross-sectional views of a deposition unit during a wafer transfer and placement according to an embodiment of the present disclosure.

Referring to FIG. 4A, a robot blade 70 may carry a wafer 50 over the carrier ring 40 while the lift pins 22 are raised above the bottom electrode 20. The wafer 50 can be laterally centered relative to the carrier ring 40. In other words, the center of the wafer 50 may be aligned to the vertical axis passing through the geometrical center of the carrier ring 40.

Figure 4B:
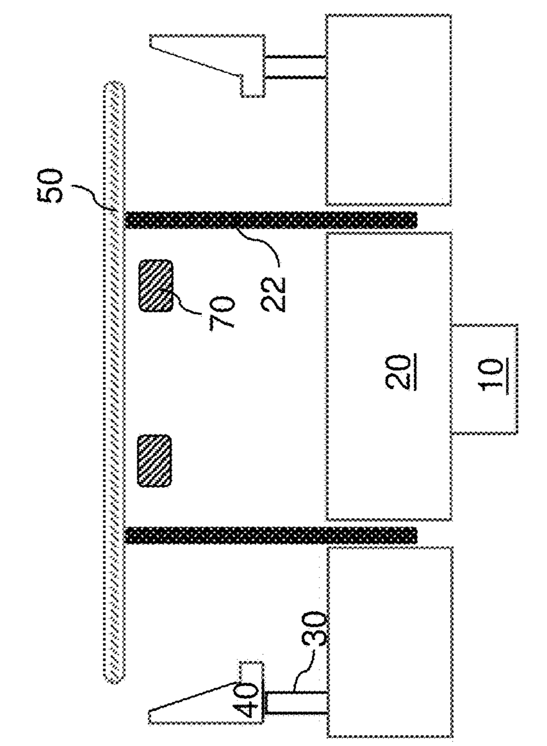

Referring to FIG. 4B, the robot blade 70 may be lowered until the wafer 50 is suspended on the lift pins 22. Subsequently, the robot blade 70 may be laterally retracted so that the robot blade 70 does not have any areal overlap with the wafer 50 in a top-down view.

Figure 4C:
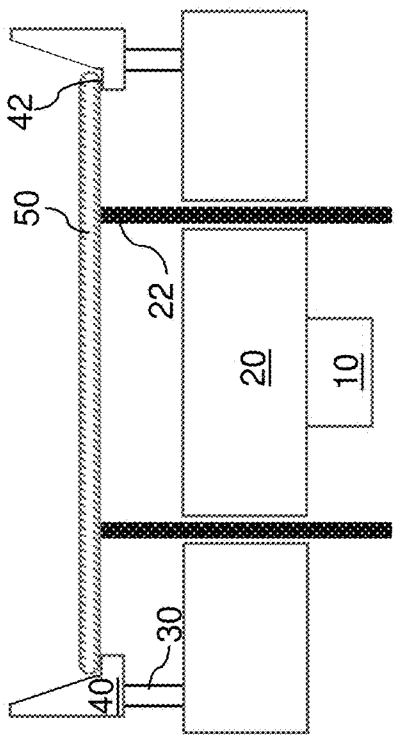

Referring to FIG. 4C, the lift pins 22 are vertically retracted, i.e., moved downward, until the wafer 50 contacts the lower top surface 42 of the step 140 of the carrier ring 40. The wafer 50 is positioned on the carrier ring 40 such that a periphery of a bottom surface of the wafer 50 contacts the lower top surface 42 of the carrier ring 40.

Figure 4D:
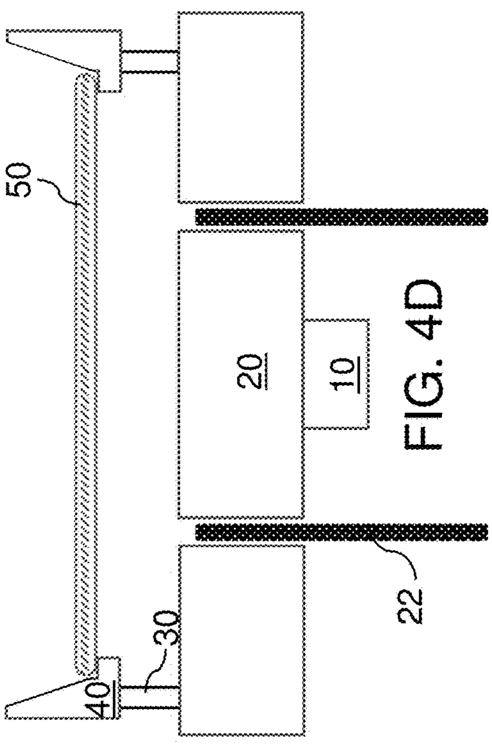

Referring to FIG. 4D, the lift pins 22 are further retracted until the top tips of the lift pins 22 are positioned below the horizontal plane including the top surface of the bottom electrode 20. An insulating, semiconductor or conductive film can be subsequently deposited on a backside surface 52 of the wafer 50 by providing the processing gases through the processing gas manifold 24.

Figure 5:
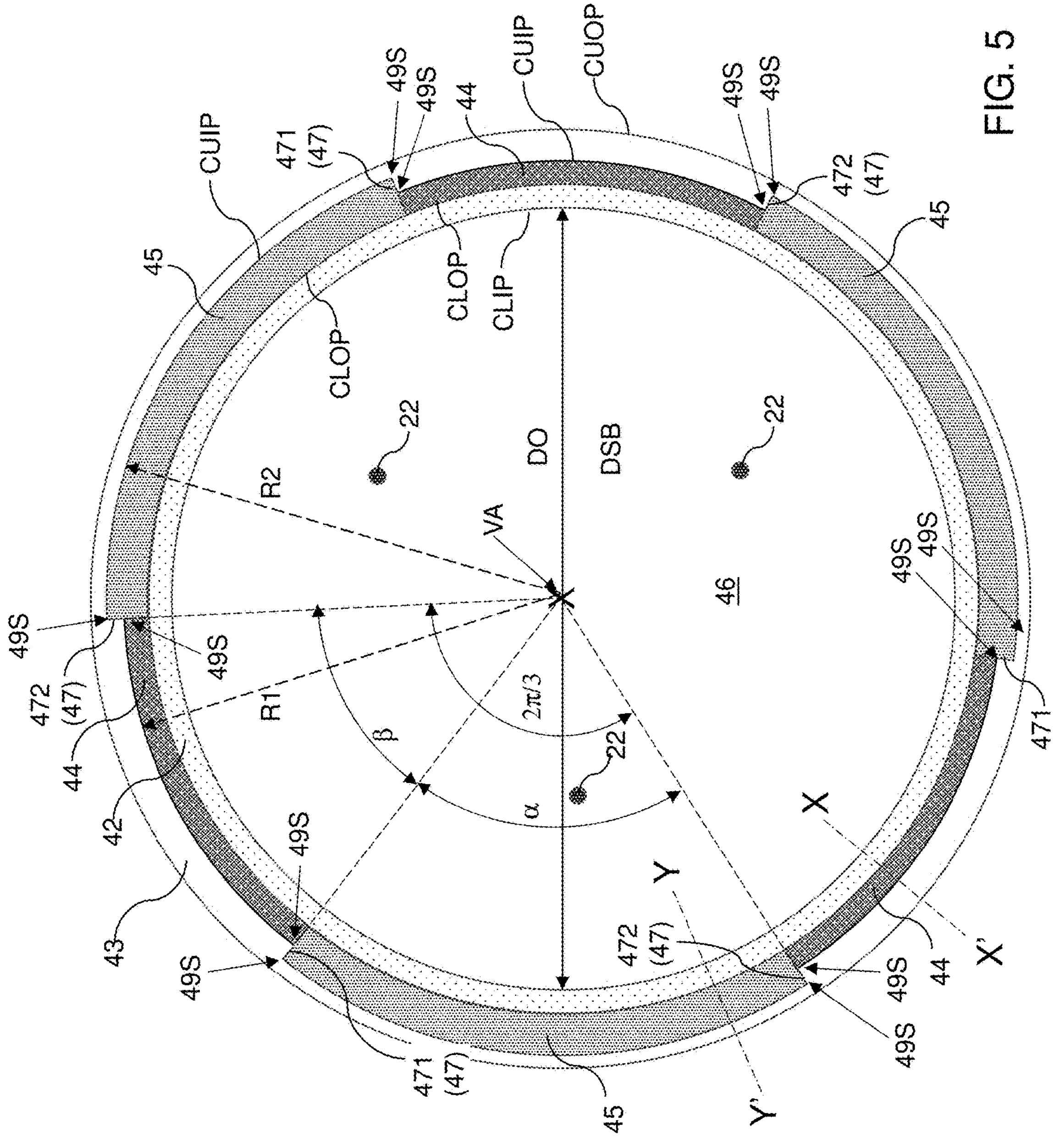
FIG. 5 is a top-down view of a second configuration of the deposition unit of FIG. 2A.
Figure 6A:
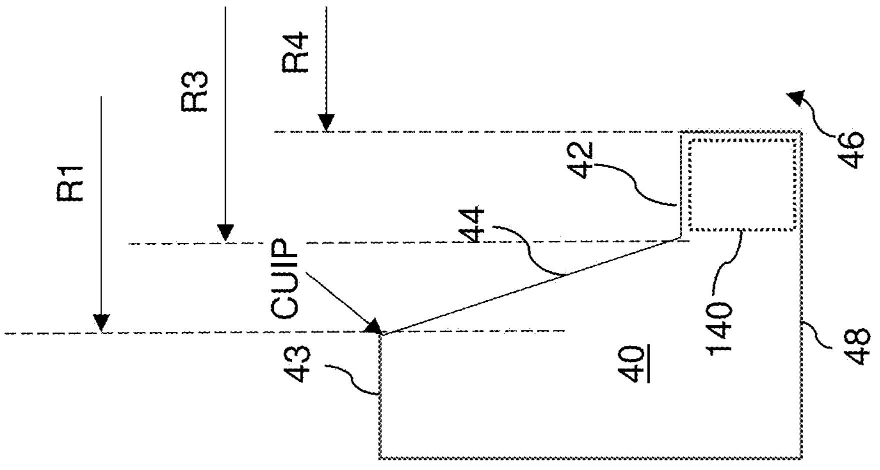
FIGS. 6A-6C are various vertical cross-sectional profiles of a carrier ring within the second configuration of the deposition unit illustrated in FIGS. 2A and 5 along the vertical plane X-X' of FIG. 5.
Figure 6B:
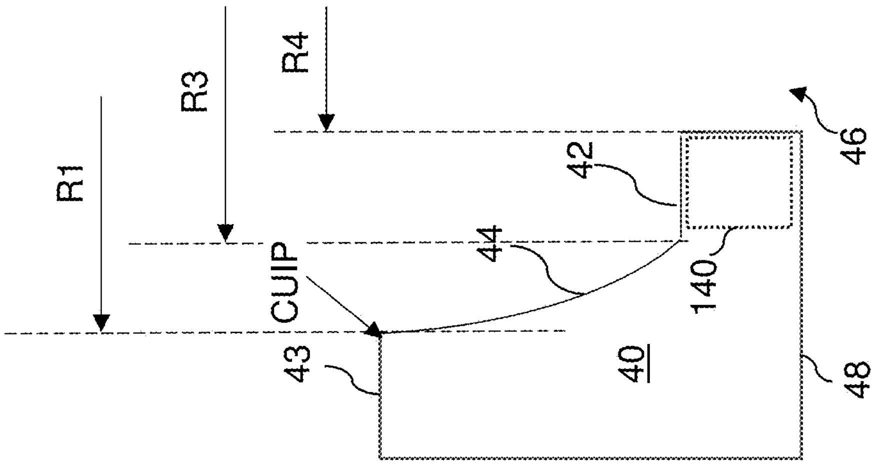
Figure 6C:
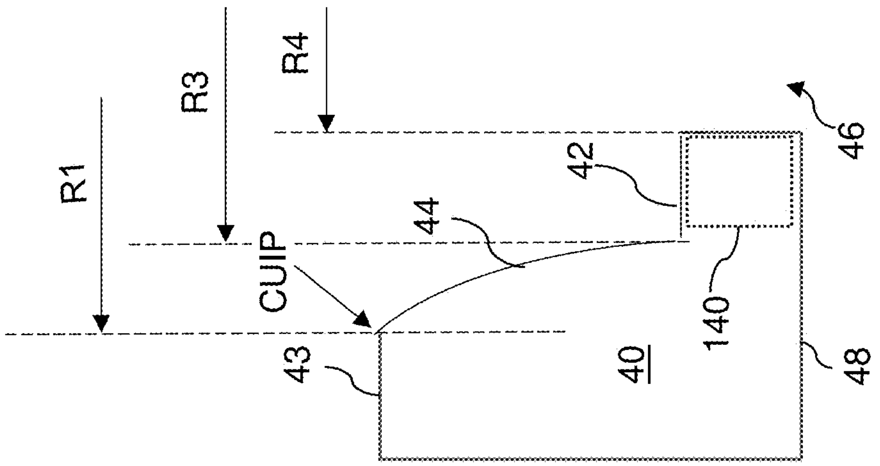

FIG. 5 is a top-down view of a second configuration of the deposition unit of FIG. 2A. FIGS. 6A-6C are various vertical cross-sectional profiles of a carrier ring 40 within the second configuration of the deposition unit illustrated in FIGS. 2A and 5 along the vertical plane X-X' of FIG. 5. FIGS. 7A-7F are various vertical cross-sectional profiles of the carrier ring 40 within the second configuration of the deposition unit illustrated in FIGS. 2A and 5 along the vertical plane Y-Y' of FIG. 5.

Referring collectively to FIGS. 2A, 5, 6A-6C, and 7A-7F, the "circular" upper outer periphery CUOP of the upper top surface 43 of the carrier ring 40 may have a non-circular shape. In one embodiment, the carrier ring 40 may comprise a contoured inner sidewall (44, 45, 47) including first inner sidewall surface segments 44, second inner sidewall surface segments 45 and vertical surface segments 47. The first inner sidewall surface segments 44 have a respective arc-shaped top periphery located at a distance of a first radius R1 from a vertical axis VA passing through a geometrical center GC of the carrier ring 40. The second inner sidewall surface segments 45 have a respective arc-shaped top periphery located at a distance of a second radius R2 from the vertical axis VA. The second radius R2 is greater than the first radius R1. In one embodiment, the arc-shaped top peripheries of the first inner sidewall surface segments 44 and the second inner sidewall surface segments 45 are located within a same horizontal plane, such as the horizontal plane including the upper top surface 43 of the carrier ring 40.

In one embodiment, the closed lower outer periphery CLOP of the lower top surface 42 has a shape of a circle. In one embodiment, the closed upper inner periphery CUIP of the upper top surface 43 has a stepped, non-circular shape as illustrated in FIG. 5.

The first inner sidewall surface segments 44 have a respective arc-shaped bottom periphery located at a distance of a third radius R3 from the vertical axis VA passing through the geometrical center GC of the carrier ring 40. The second inner sidewall surface segments 45 have a respective arc-shaped bottom periphery, which may or may not be located at the distance of the third radius R3 from the vertical axis VA. The third radius R3 is less than the first radius R1, and is greater than the maximum radius of the wafer 50 that is placed over the carrier ring 40. The arc-shaped bottom peripheries of the first inner sidewall surface segments 44 and the second inner sidewall surface segments 45 coincide with the closed lower outer periphery CLOP of the lower top surface 42.

Generally, the closed lower outer periphery CLOP of the lower top surface 42 may or may not be a circle. In one embodiment, the closed lower outer periphery CLOP of the lower top surface 42 may be a circle, and the second inner sidewall surface segments 45 have a respective arc-shaped bottom periphery located at the distance of the third radius R3 from the vertical axis VA. In another embodiment, the closed lower outer periphery CLOP of the lower top surface 42 may not be a circle, and the second inner sidewall surface segments 45 have a respective arc-shaped bottom periphery located at the distance that is greater than the third radius R3 from the vertical axis VA.

The lower top surface 42 has a circular lower inner periphery CLIP having a shape of a circle. The radius of this circle is herein referred to as a fourth radius R4. The fourth radius R4 can be one half of the opening diameter DO.

The vertical surface segments 47 can be contained within a respective vertical plane including the vertical axis VA and azimuthally spaced apart from one another around the vertical axis VA. In one embodiment, each of the vertical surface segments 47 may be adjoined to a slanted edge 49S of a respective one of the first inner sidewall surface segments 44 and to a slanted edge 49S of a respective one of the second inner sidewall surface segments 45. As used herein, a slanted edge refers to an edge contained entirely within a vertical plane and having a uniform or non-uniform slant angle, i.e., a taper angle, with respective to a vertical direction.

In one embodiment, a total of 2N vertical surface segments 47 can be provided, in which N is an integer greater than 2. The contoured inner sidewall (44, 45, 47) may have an N-fold rotational symmetry around the vertical axis VA. In one embodiment, the vertical surface segments 47 comprise: first vertical surface segments 471, within which each neighboring pair is azimuthally spaced from each other around the vertical axis VA by 2p/N, N being an integer greater than 2; and second vertical surface segments 472, within which each neighboring pair is azimuthally spaced from each other around the vertical axis VA by 2p/N.

In one embodiment, a neighboring pair of the first vertical surface segment 471 and the second vertical surface segment 472 separated by a respective one of the second inner sidewall surface segments 45 is azimuthally spaced from each other around the vertical axis VA by a first angle a that is not greater than p/N. Another neighboring pair of the first vertical surface segment 471 and a second vertical surface segment 472 separated by a respective one of the first inner sidewall surface segments 44 is azimuthally spaced from each other around the vertical axis VA by a second angle b that is not greater than p/N. The sum of the first angle a and the second angle b may equal p/N. In one embodiment, each first inner sidewall surface segments 44 may have an azimuthal extent of the first angle a, and each second inner sidewall surface segments 45 may have an azimuthal extent of the second angle b.

In the embodiment of FIG. 6A, the first inner sidewall surface segments 44 may be inclined outward at a non-zero taper angle relative to the vertical direction. For example, the first inner sidewall surface segments 44 may be a flat surface that is inclined outward away from the opening 46 at the taper angle of 10 to 60 degrees, such as 30 to 45 degrees, relative to the vertical direction which is perpendicular to the lower top surface 42 of the step 140.

In the embodiment of FIG. 6B, the first inner sidewall surface segments 44 may comprise horizontally-concave surface segments. In one embodiment, each of the first inner sidewall surface segments 44 comprises a continuous horizontally-concave surface segment.

In the embodiment of FIG. 6C, the first inner sidewall surface segments 44 may comprise horizontally-convex surface segments. In one embodiment, each of the first inner sidewall surface segments 44 comprises a continuous horizontally-convex surface segment.

Figure 7A:
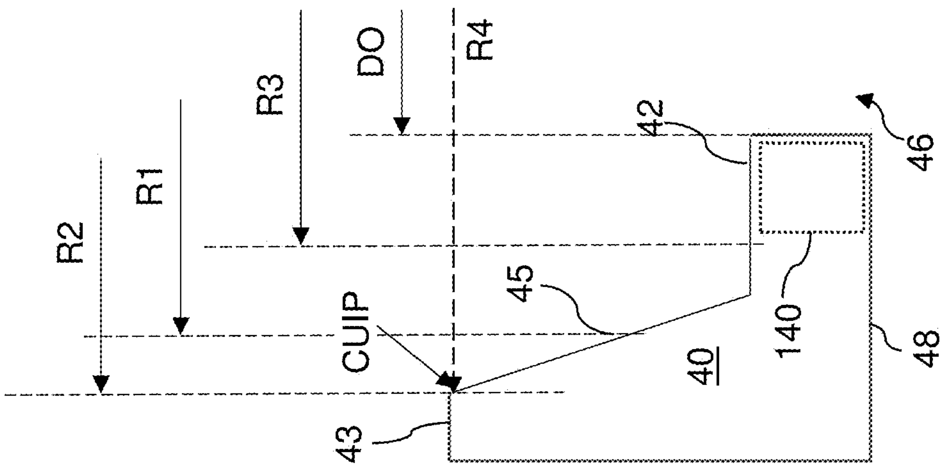
FIGS. 7A-7F are various vertical cross-sectional profiles of the carrier ring within the second configuration of the deposition unit illustrated in FIGS. 2A and 5 along the vertical plane Y-Y' of FIG. 5.
Figure 7B:
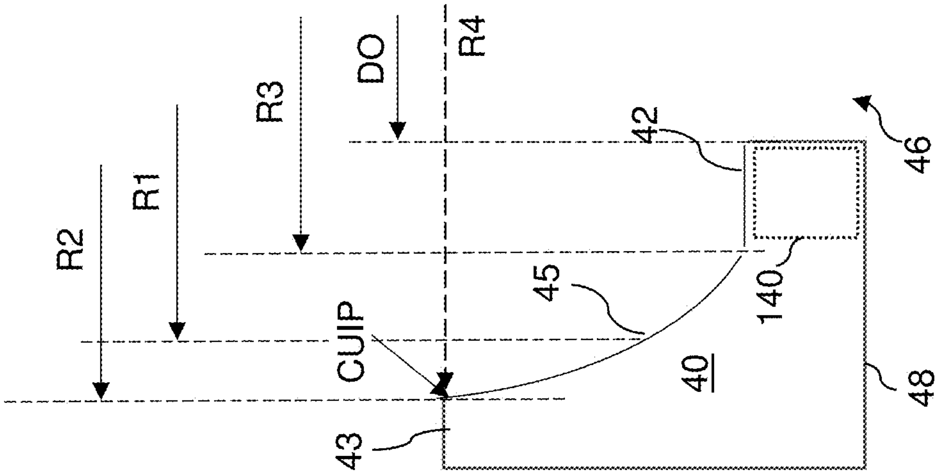
Figure 7C:
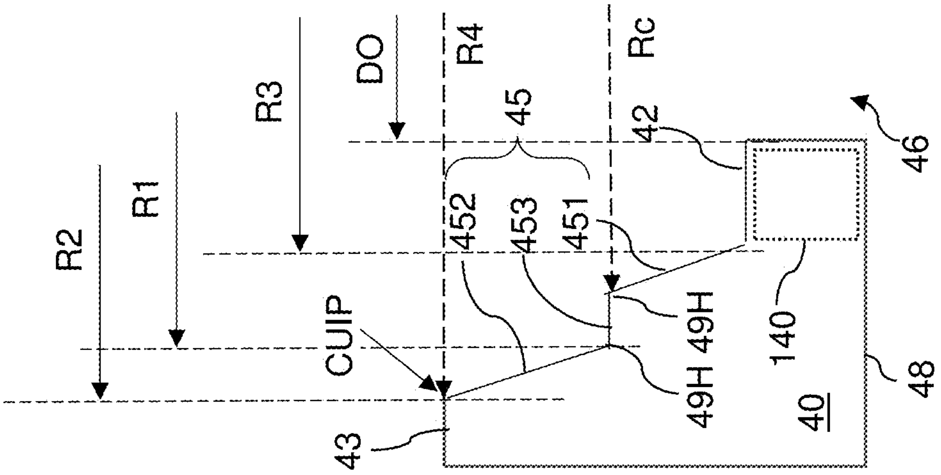
Figure 7D:
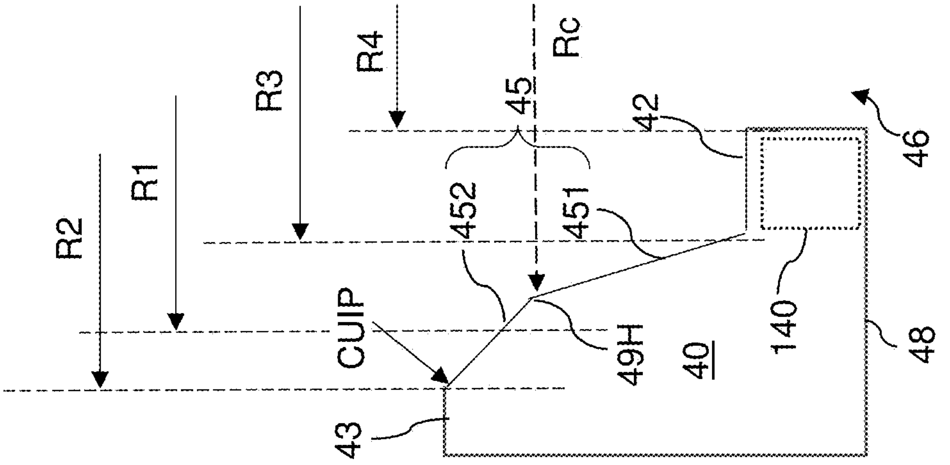
Figure 7E:
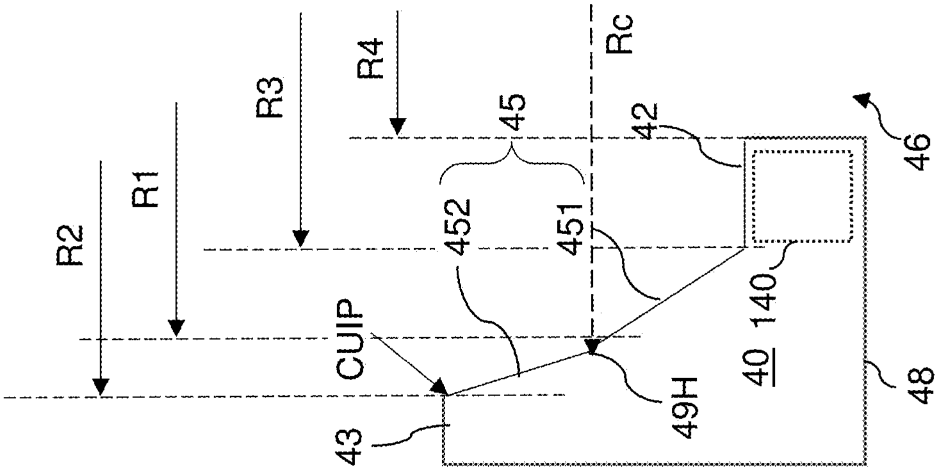

In some embodiments, such as embodiments illustrated in FIGS. 7B and 7E, the second inner sidewall surface segments 45 may comprise horizontally-concave surface segments. In the embodiment of FIG. 7B, each of the second inner sidewall surface segments 45 comprises a continuous horizontally-concave surface segment. In the embodiment of FIG. 7E, each of the second inner sidewall surface segments 45 comprises a plurality of inner sidewall segments (451, 452) and at least one edge, such as an arc-shaped horizontally-extending edge 49H, at which a respective pair of inner sidewall segments (451, 452) are adjoined to each other at an angle less than 180 degrees. In other words, the outward taper angles (as measured relative the vertical direction in a vertical cross-sectional view) of the inner sidewall segments (451, 452) may be different from each other, such that the bottom surface segment 451 has a greater outward taper angle than the top surface segment 452. The surface segments 451 and 452 are located at different heights from each other. The arc-shaped horizontally-extending edge 49H has a radius of curvature Rc less than the second radius R2.

Figure 7F:
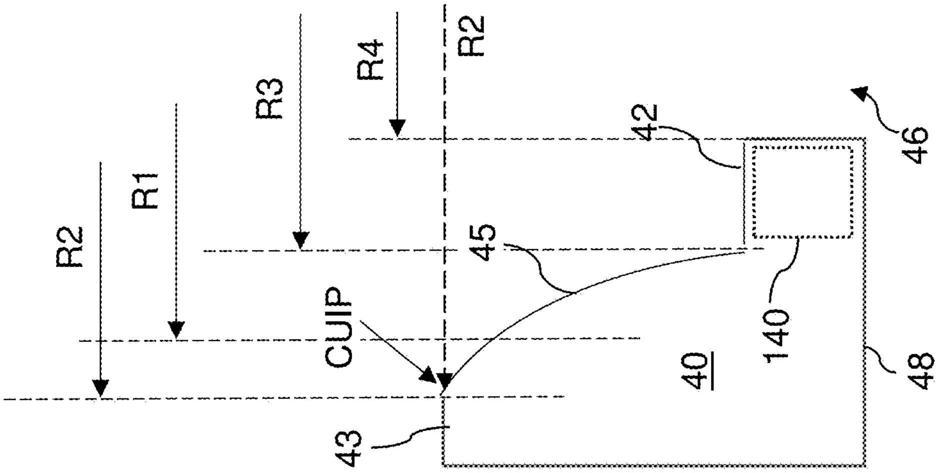

In other embodiments, such as embodiments illustrated in FIGS. 7D and 7F, the second inner sidewall surface segments 45 may comprise horizontally-convex surface segments. In the embodiment of FIG. 7F, each of the second inner sidewall surface segments 45 comprises a continuous horizontally-convex surface segment. In the embodiment of FIG. 7D, each of the second inner sidewall surface segments 45 comprises a plurality of inner sidewall segments (451, 452) and at least one edge, such as an arc-shaped horizontally-extending edge 49H, at which a respective pair of inner sidewall segments (451, 452) are adjoined to each other at an angle greater than 180 degrees. In other words, the outward taper angles (as measured relative the vertical direction in a vertical cross-sectional view) of the inner sidewall segments (451, 452) may be different from each other, such that the top surface segment 452 has a greater outward taper angle than the bottom surface segment 451. The surface segments 451 and 452 are located at different heights from each other. The arc-shaped horizontally-extending edge 49H has a radius of curvature Rc less than the first radius R1 and the second radius R2.

In some embodiments, the contoured inner sidewall (44, 45, 47) may comprise connecting surface segments 453 that connects a respective pair of surface segments (451, 452) that are inclined outward at a non-zero taper angle. In one embodiment, the connecting surface segments 453 may comprise horizontal sector-shaped surface segments having an azimuthal extent of the second angle b.

In some embodiments illustrated in FIGS. 7C, 7D, and 7E, arc-shaped bottom peripheries of the first inner sidewall surface segments 44 coincide with first segments of the closed lower outer periphery CLOP of the lower top surface 42, and arc-shaped bottom peripheries of the second inner sidewall surface segments (such as the bottom surface segments 452) coincide with second segments of the closed lower outer periphery CLOP of the lower top surface 42. As discussed above, the closed lower outer periphery CLOP of the lower top surface 42 may, or may not, have a shape of a circle.

In some embodiments, arc-shaped bottom peripheries of the second inner sidewall surface segments 45 coincide with segments of the closed lower outer periphery CLOP of the lower top surface 42 as illustrated in FIGS. 7A-7F. In some embodiments, the second inner sidewall surface segments 45 have a concave or convex vertical cross-sectional profile as illustrated in FIGS. 7B and 7F.

In summary, the contoured inner sidewall (44, 45, 47) connects the closed upper inner periphery CUIP of the upper top surface 43 and the closed lower outer periphery CLIP of the lower top surface 42, and comprises at least one edge (49H, 49S) at which a respective pair of inner sidewall segments {(451, 452, 453); (44, 47); or (45, 47)} are adjoined to each other at a respective angle, which may be orthogonal if the edge is vertical, or may be non-orthogonal if the edge is horizontal.

In some embodiments, the contoured inner sidewall (44, 45, 47) comprises vertical surface segments 47 contained within a respective vertical plane including a vertical axis VA passing through a geometrical center GC of the carrier ring 40; the vertical surface segments 47 are azimuthally spaced apart from one another around the vertical axis VA; and the at least one edge comprises a plurality of slanted edges 49S at which a respective one of the vertical surface segments 47 is adjoined to a respective azimuthally-extending surface segment (44, 45) of the contoured inner sidewall {41, (44, 45, 47)}.

In some embodiments, the at least one edge comprises an arc-shaped horizontally-extending edge 49H having an azimuthal angle (g, a, or b) of at least p/24 around a vertical axis VA passing through a geometrical center GC of the carrier ring 40. In some embodiments, the contoured inner sidewall {41, (44, 45, 47)} comprises: a first (e.g., bottom) horizontally-concave surface segment (411 or 451) having a first outward taper angle relative to a vertical direction; and a second (e.g., top) horizontally-concave surface segment (412 or 452) having a second outward taper angle relative to the vertical direction, which is different from the first outward taper angle. In some embodiments, the first horizontally-concave surface segment (411 or 451) is adjoined to the second horizontally-concave surface segment (412 or 452) at the arc-shaped horizontally-extending edge 49H. In some embodiments, the first horizontally-concave surface segment 451 is adjoined to the second horizontally-concave surface segment 452 through a horizontal surface segment 453 that has an edge which coincides with at the arc-shaped horizontally-extending edge 49H.

In one embodiment, a contoured inner sidewall 41 may comprise at least one an arc-shaped horizontally-extending edge 49H having an azimuthal angle of at least p/24 around a vertical axis VA passing through a geometrical center GC of the carrier ring 40. In the illustrated example of FIGS. 2B and 3B-3C, the azimuthal angle g can be 2p. Alternatively, the azimuthal angle (a or b) is not greater than p/3 as illustrated in FIGS. 5, 6A-6C, and 7A-7C.

In one embodiment, the first (e.g., bottom) horizontally-concave surface segment (411 or 451) may have a bottom edge that coincides with the closed lower outer periphery CLOP, and the second (e.g., top) horizontally-concave surface segment (412 or 452) may have a top edge that coincides with the closed upper inner periphery CUIP.

Figure 8:
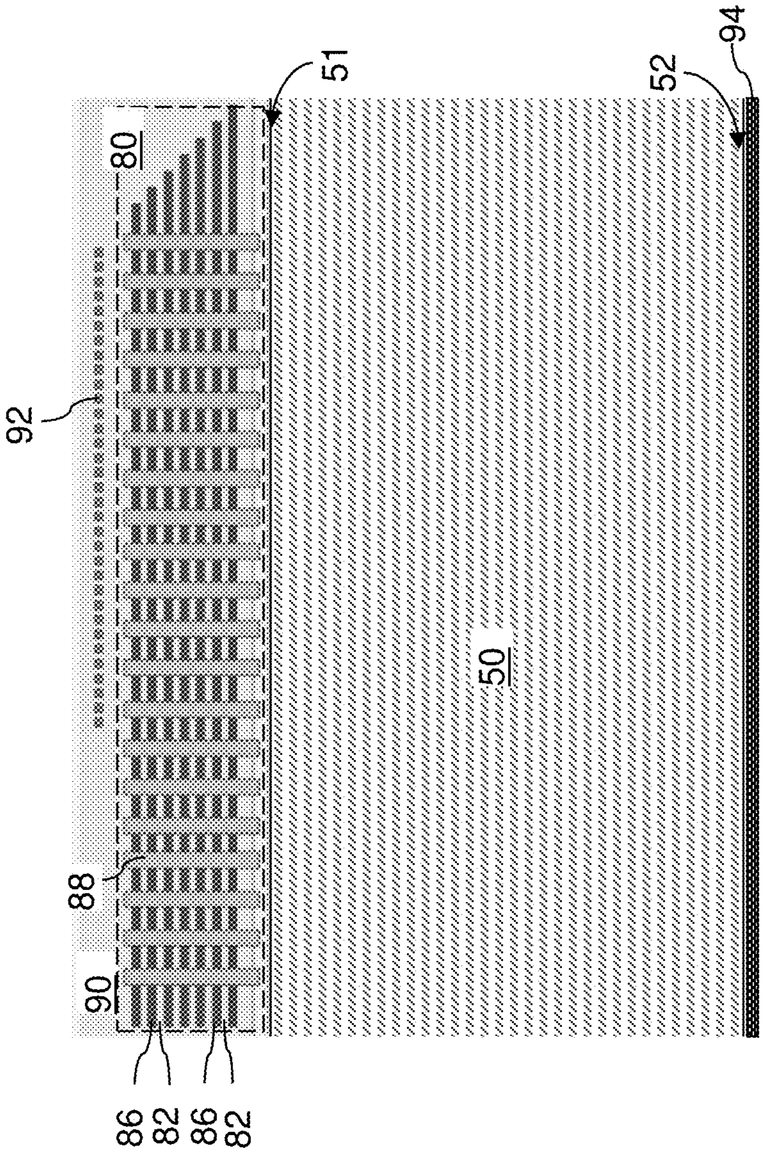
FIG. 8 is a schematic vertical cross-sectional view of semiconductor device located and stress compensation film located on opposite sides of a wafer, according to various embodiments of the present disclosure.

FIG. 8 illustrates a semiconductor device 80, such as a three-dimensional NAND memory device located on the front surface 51 of the wafer 50. The device 80 includes a vertically alternating stack of insulating layers 82 and electrically conductive layers 86, and a two-dimensional array of memory openings vertically extending through the vertically alternating stack (82, 86). The electrically conductive layers 86 may comprise word lines of the three-dimensional NAND memory device. A memory opening fill structure 88 may be formed within each memory opening. The memory opening fill structure 88 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 88 and adjacent portions of the electrically conductive layers 86 constitute a vertical NAND string. Alternatively, the memory opening fill structures 88 may include any type of non-volatile memory elements such as resistive memory elements, ferroelectric memory elements, phase change memory elements, etc. The electrically conductive layers 86 may be patterned to provide a terrace region. Contact via structures (not shown) may be formed on the electrically conductive layers 86 in the terrace region to provide electrical connection to the electrically conductive layers 86. Dielectric material portions 90 may be formed around each vertically alternating stack (82, 86) to provide electrical isolation between neighboring vertically alternating stacks (82, 86). Bit lines 92 may electrically contact drain regions located above the semiconductor channel at the top of the memory opening fill structures 88.

The multiple word lines 86 typically extend in a single word line direction and generate significant stress at a wafer level, which can distort the wafer 50. Wafer warpage may degrade lithographic patterning processes and/or induce arcing during plasma-enhanced chemical vapor deposition processes.

In one embodiment, the method and apparatus of the embodiments of the present disclosure described above may be used to deposit a backside stress compensation film 94 on the backside surface 52 of the semiconductor wafer 50. The backside stress compensation film 94 reduces the wafer warpage to make the wafer 50 more planar. The backside stress compensation film 94 may be formed on the backside surface 52 of the wafer 50 before or after forming the semiconductor device 80 over the front surface 51 of the wafer 50. The semiconductor device 80 may be deposited over the front surface 51 of the wafer 50 in at least one additional vacuum chamber other than the vacuum chamber 190 used to deposit the backside stress compensation film 94 in the same and/or different deposition apparatus as the apparatus 10 containing the vacuum chamber 190.

The backside stress compensation film 94, such as a silicon nitride layer, may be in compressive or tensile stress depending on the RF power applied during the PECVD process described above. For example, a lower RF power (e.g., 400W to 650W) results in layer with a positive sign of the stress (i.e., tensile stress), while a higher RF power (e.g., 750W to 1000W) results in a layer with a negative sign of the stress (i.e., compressive stress).

The various embodiments of the present disclosure can be employed to provide a carrier ring 40 which induces self-centering of the wafer 50 on the lower top surface 42 of the step 140 of the carrier ring 40. The contoured inner sidewall {41, (44, 45, 47)} helps to prevent misplacement of the wafer 50 on the carrier ring 40. In addition, the contoured inner sidewall {41, (44, 45, 47)} of the carrier ring 40 provides an opening 46 diameter DO (i.e., twice the fourth radius R4) that minimizes the contact area between the backside surface 52 of the wafer 50 and the lower top surface 42 of the carrier ring 40, and thus, minimizes the backside surface 52 area of the wafer 50 that is blocked by the carrier ring 40 during the stress compensation film 94 deposition process.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method, comprising:

placing a wafer on a step of a carrier ring in a first vacuum enclosure, wherein a backside surface of the wafer contacts the step;

depositing a film on an exposed portion of the backside surface of the wafer while the backside surface of the wafer is in contact with the step; and depositing a semiconductor device on a front side of the wafer which is opposite to the backside surface of the wafer, wherein:

the carrier ring comprises a bottom surface surrounding an opening in the carrier ring, an upper top surface, a lower top surface of the step, and an inner surface which connects the upper top surface and the lower top surface, and which is inclined outward at a non-zero taper angle relative to the vertical direction which perpendicular to the lower top surface of the step;

the bottom surface comprises an annular bottom surface having a circular bottom inner periphery;

the upper top surface has an upper outer periphery and closed upper inner periphery;

the lower top surface is vertically offset downward relative to the upper top surface and comprises a circular lower inner periphery that defines the opening in the carrier ring and comprising a closed lower outer periphery;

the inner sidewall comprises a contoured inner sidewall that connects the closed upper inner periphery and the closed lower outer periphery and comprises at least one edge at which a respective pair of inner sidewall segments are adjoined to each other at a respective angle that is greater than or less than 180 degrees;

the upper outer periphery of the upper top surface of the carrier ring has a non-circular shape;

the contoured inner sidewall comprises first inner sidewall surface segments, second inner sidewall surface segments, and vertical surface segments;

the first inner sidewall surface segments have a respective arc-shaped top periphery located at a distance of a first radius from a vertical axis passing through a geometrical center of the carrier ring; and the second inner sidewall surface segments have a respective arc-shaped top periphery located at a distance of a second radius from the vertical axis; and the second radius is greater than the first radius.

2. The method of claim 1, wherein the step of depositing the semiconductor device occurs in at least one second vacuum enclosure different from the first vacuum enclosure before or after the step of depositing the film.

3. The method of claim 1, wherein the film comprises a silicon nitride stress compensation layer and the semiconductor device comprises a memory device.

4. The method of claim 3, wherein the step of depositing the film comprises depositing the silicon nitride stress compensation layer by plasma enhanced chemical vapor deposition by supplying at least one processing gas from below the carrier ring through the opening in the carrier ring to the backside surface of the wafer.

5. The method of claim 1, wherein the taper angle is 10 to 60 degrees outward away from the opening relative to the vertical direction.

* * * * *